(12) United States Patent
Shiotani

(10) Patent No.: US 9,793,934 B2
(45) Date of Patent: Oct. 17, 2017

(54) WIRELESS RECEIVER

(71) Applicant: KABUSHIKI KAISHA AUDIO-TECHNICA, Machida-shi, Tokyo (JP)

(72) Inventor: Masaki Shiotani, Machida-shi (JP)

(73) Assignee: KABUSHIKI KAISHA AUDIO-TECHNICA, Machida-shi, Tokyo (JP)

( * ) Notice: Subject to any disclaimer, the term of this patent is extended or adjusted under 35 U.S.C. 154(b) by 0 days.

(21) Appl. No.: 15/295,254

(22) Filed: Oct. 17, 2016

(65) Prior Publication Data

US 2017/0111068 A1   Apr. 20, 2017

(30) Foreign Application Priority Data

Oct. 19, 2015   (JP) ................. 2015-205503

(51) Int. Cl.
*H04B 1/10*   (2006.01)
*H04B 17/336*   (2015.01)
*H03F 3/19*   (2006.01)
*H03G 3/30*   (2006.01)
*H03G 3/34*   (2006.01)

(52) U.S. Cl.
CPC ............. *H04B 1/10* (2013.01); *H03F 3/19* (2013.01); *H03G 3/3042* (2013.01); *H03G 3/341* (2013.01); *H03G 3/344* (2013.01); *H04B 17/336* (2015.01); *H03F 2200/451* (2013.01)

(58) Field of Classification Search
CPC ...... H04B 1/1669; H04B 1/10; H04B 1/1027; H04B 7/0814; H04B 1/04; H04B 1/1646; H04B 1/1661; H04B 1/202; H04B 1/406; H04B 1/66; H04B 2203/545; H04B 2203/5454; H04B 3/54
USPC ........................................... 455/222
See application file for complete search history.

(56) References Cited

U.S. PATENT DOCUMENTS 4,607,392 A * 8/1986 Nolde ............... H03D 3/004
455/192.1
2005/0169410 A1* 8/2005 Tanaka ............... H04L 1/203
375/346

FOREIGN PATENT DOCUMENTS

JP   H07-202733 A   8/1995
JP   H11-206169 A   7/1999

* cited by examiner

*Primary Examiner* — Ajibola Akinyemi
(74) *Attorney, Agent, or Firm* — Manabu Kanesaka

(57) ABSTRACT

A wireless receiver includes an RF muting circuit that opens and closes a signal line of a demodulated signal according to a received carrier strength level, a noise muting circuit that opens and closes the signal line according to a noise level in the modulated signal, and an RF attenuation circuit that attenuates a RF signal handled in a RF amplifier circuit, and additionally includes a reception mode switching circuit which can simultaneously select at least any two values from those comprising one of a plurality of predetermined threshold values of the RF muting circuit, one of a plurality of predetermined threshold values of the noise muting circuit and one of a plurality of predetermined amount of attenuation of the RF attenuation circuits. This configuration allows to provide a wireless receiver having a stable reception characteristics without sound interruption or interferences in a multi-wave operation of wireless microphones.

8 Claims, 4 Drawing Sheets

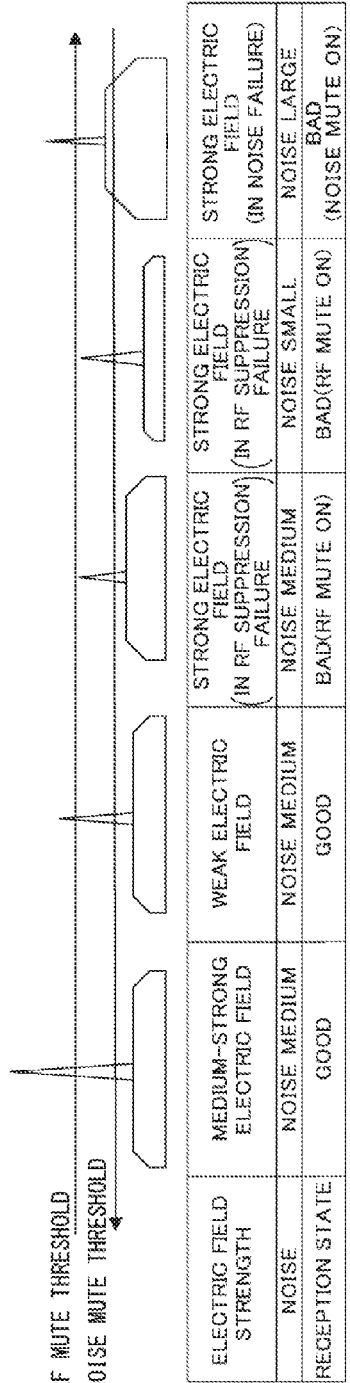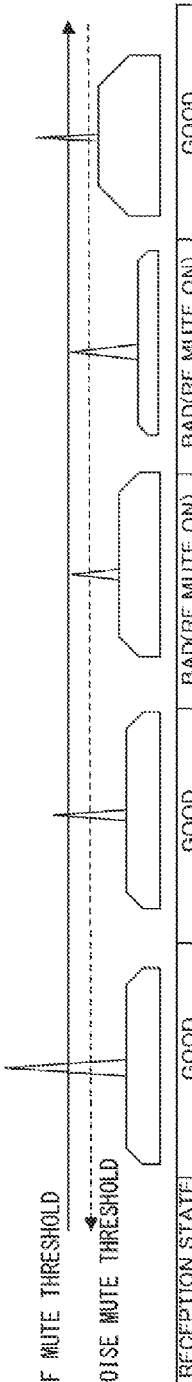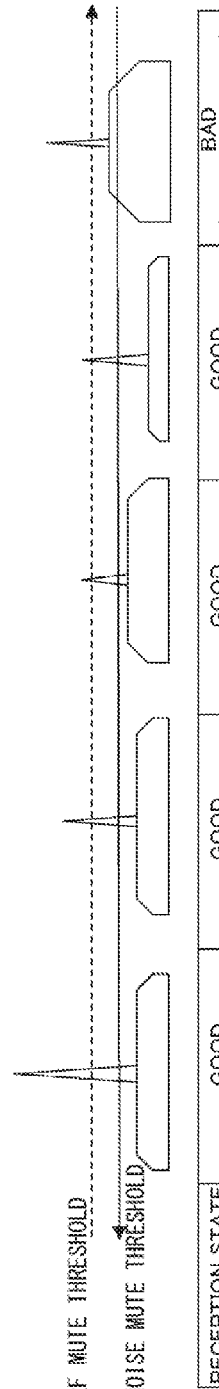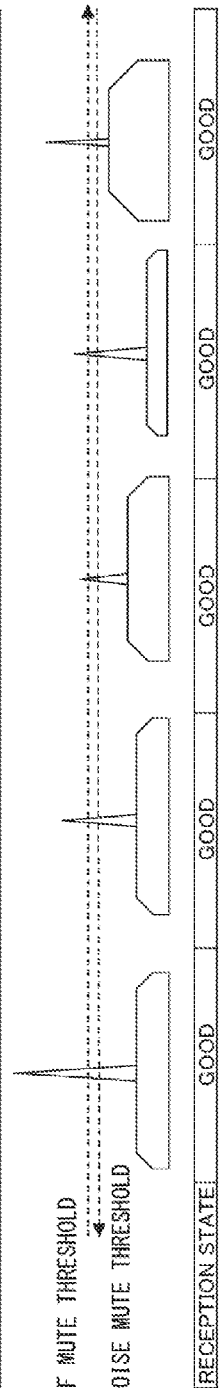

WIRELESS RECEIVER

RELATED APPLICATIONS

The present application is based on, and claims priority from, Japanese Application No. JP2015-205503 filed Oct. 19, 2015, the disclosure of which is hereby incorporated by reference herein in its entirety.

BACKGROUND OF THE INVENTION

Field of the Invention

The invention relates to a wireless receiver that receives a radio wave from, for example, a wireless microphone and demodulates an audio signal, and in particular relates to a wireless receiver capable of obtaining stable reception characteristics in multi-wave operation in which a plurality of wireless microphones is simultaneously used.

Description of the Related Art

A wireless microphone and a wireless receiver are normally used in one-to-one relationship.

That is, in multi-wave operation in which a plurality of wireless microphones is simultaneously used on a stage or the like, the same number of wireless receivers tuned to transmission frequencies of the respective wireless microphones are used.

In this case, according to Japanese Radio Law, for example, as a frequency band that can be used for a type B wireless microphone, 30 channels are assigned for a specified low power radio device, in which a range of 806.125 to 809.750 MHz is equally divided in units of 0.125 MHz.

Therefore, in a case where the plurality of wireless microphones is simultaneously used as described above, it is necessary to set a transmission frequency of each of the wireless microphones so that the wireless receiver is not influenced by co-channel interference, adjacent-channel interference, or intermodulation interference, and also operation is necessary to match a reception frequency of the wireless receiver to be paired with the transmission frequency of each of the wireless microphones.

However, even when the above-described countermeasures are taken, for example, in a case where the wireless microphones on the stage are close to each other, or in a case where the plurality of wireless microphones simultaneously approaches the antenna of the wireless receiver (in a case of a strong electric field), the wireless receiver is easily influenced by the above-described interference.

As a result, the wireless receiver may be subjected to interference in which a radio wave of a desired reception frequency is suppressed, and interference also occurs in which a noise level of a demodulated signal is increased due to influence of an interference wave.

Accordingly, a conventional wireless receiver includes a muting circuit (also referred to as a squelch circuit) in order to remove audibly unpleasant noise that is generated when being subjected to the above-described interference. As for the muting circuit, a noise muting circuit that opens and closes a signal line according to a noise level in a modulated audio signal, and an RF muting circuit that opens and closes the signal line according to a carrier strength level have been proposed, and are disclosed in patent documents, for example, JP 11-205169 A, or JP 07-202733 A.

SUMMARY OF THE INVENTION

In this kind of wireless receiver, when, for example, a modulated RF signal (hereinafter referred to as an RF signal) of a strong electric field of 100 dBpV or greater is inputted, intermodulation distortion occurs due to nonlinearity of an RF amplifier circuit or mixer circuit. The intermodulation distortion also influences an intermediate frequency amplification circuit in a subsequent stage, for example, and a frequency of an intermodulation (IM) component is mixed into an intermediate frequency (IF) signal. The IM component mixed into the IF band cannot be removed by a filter or the like.

A countermeasure against the mixing is to prevent an RF signal stronger than required from being applied to the RF amplifier, whereby occurrence of IM distortion can be suppressed. For this purpose, a means can be adopted that attenuates a level of the RF signal by inserting an attenuator before the RF amplifier or adjusting gain of the RF amplifier.

By the way, the means that attenuates the level of the RF signal is effective especially at the time of the above-described multi-wave operation. However, at the time of normal operation in which a single wireless microphone is used in a predetermined area, the means causes reception sensitivity of the wireless receiver to decrease. Therefore, a problem arises on a practical side, for example, of substantial shortening of a reception reaching distance of the wireless microphone, or of increase of demodulated noise.

The invention has been made based on the above-described technical point of view, and in particular intends to provide a wireless receiver capable of reducing the influence of an interference wave that occurs in a case where the RF signal of the strong electric field is inputted to this kind of wireless receiver.

In addition, an object of the invention is to provide a wireless receiver capable of obtaining stable reception characteristics without sound interruption or interference at the time of the multi-wave operation of the above-described wireless microphone, and effectively eliminating an increase of the demodulated noise by securing sufficient reception sensitivity at the time of the normal operation in which a single wireless microphone is used.

A wireless receiver according to the present invention that has been made to solve the above-described problem, includes: an RF muting circuit that opens and closes a signal line of a demodulated signal according to a carrier strength level of a received RF signal; a noise muting circuit that opens and closes the signal line of a demodulated signal according to a noise level in the demodulated signal; an RF signal attenuation circuit that attenuates a level of the RF signal that is dealt with in an RF amplifier circuit; and a reception mode switching unit capable of simultaneously selecting at least any two values from those comprising one of a plurality of predetermined operating levels in the RF muting circuit, one of a plurality of predetermined operating levels in the noise muting circuit, and one of a plurality of predetermined amounts of attenuation in the RF signal attenuation circuit.

In this case, the reception mode switching unit is preferably configured to select operating levels of the RF muting circuit, operating levels of the noise muting circuit, and the amounts of attenuation in the RF signal attenuation circuit, in multiple steps of two or more.

A reception mode is adopted in which the operating level of the RF muting circuit is lowered and the operating level of the noise muting circuit is raised, and the attenuation in the RF signal attenuation circuit is increased, by the reception mode switching unit, at the time of multi-wave operation in which multiple transmitters are used in a predetermined area in contrast with the time of normal operation in which a single transmitter is used in the predetermined area.

In this case, the transmitter is a wireless microphone, and the wireless receiver according to the present invention performs a function that receives a transmission signal from the wireless microphone, and generates a demodulated signal.

Meanwhile, in the wireless receiver according to the present invention, an RF signal attenuator connected to an input side of the RF amplifier circuit can be suitably used as the RF signal attenuation circuit.

As the RF signal attenuation circuit that is used in the wireless receiver according to the present invention, a configuration can be adopted that includes a gain adjustment circuit that adjusts amplification gain of the RF amplifier circuit.

Further, the RF muting circuit in the wireless receiver according to the present invention includes a first comparison circuit which compares an RSSI signal corresponding to the electric field strength of the received RF signal with a first set value or a second set value both of which are different to each other, and a first selection switch which switches supply of the first set value or the second set value to the first comparison circuit. Moreover, the noise muting circuit includes a second comparison circuit which compares noise level in the demodulated signal with a third set value or a fourth set value both of which are different to each other, and a second selection switch which switches supply of the third set value or the fourth set value to the second comparison circuit.

In this case, the first set value is set to be greater than the second set value and the third set value is set to be greater than the fourth set value. At the time of normal operation, the reception mode switching unit switches such that the first comparison circuit selects the first set value and the second comparison circuit selects the fourth set value, and at the time of multi-wave operation, the reception mode switching unit switches such that the first comparison circuit selects the second set value and the second comparison circuit selects the third set value.

With the wireless receiver of the above-described configuration, regarding the amount of attenuation in the RF signal attenuation circuit, in addition to the operating level of the RF muting circuit and the operating level of the noise muting circuit, it is configured so that any two of those can be simultaneously selected by the reception mode switching unit.

Therefore, a multi-wave operation mode can be selected in which the operating level of the RF muting circuit is lowered and the operating level of the noise muting circuit is raised, and the amount of attenuation in the RF signal attenuation circuit is increased, by using the reception mode switching unit, at the time of multi-wave operation in which multiple transmitters (wireless microphones) are used in the predetermined area.

By selecting the multi-wave operation mode, it is possible to effectively suppress occurrence of the intermodulation (IM) distortion that occurs when the RF signals from the plurality of wireless microphones are simultaneously received, or influence on operation of the muting circuit due to interference of an adjacent channel.

At the same time, since the operating level (threshold) of the RF muting circuit is set low, it is possible to eliminate sound interruption caused by suppression of the radio wave of a desired reception frequency due to interference (decrease in electric field strength). Furthermore, since the operating level (threshold) of the noise muting circuit is set high, it is possible to prevent mute operation from being performed even when a little noise is generated by influence of an interference signal. As a result, it becomes possible to prevent a decrease of the reception reaching distance in the wireless receiver, and to obtain a stable reception state.

Meanwhile, in a case where a normal operation mode is selected in which a single wireless microphone is used in the predetermined area, a setting is made in which the operating level of the RF muting circuit is raised and the operating level of the noise muting circuit is lowered, and the amount of attenuation in the RF signal attenuation circuit is reduced, by using the reception mode switching unit.

Thus, the reception sensitivity of the wireless receiver can be improved, and a large reception reaching distance can be secured.

BRIEF DESCRIPTION OF THE DRAWING

FIGS. 2A to 2D are schematic diagrams each illustrating a relationship between a reception state and change of a radio wave environment (electric field strength and noise) in an actual use state of the wireless receiver;

DESCRIPTION OF THE PREFERRED EMBODIMENTS

Figure 1:
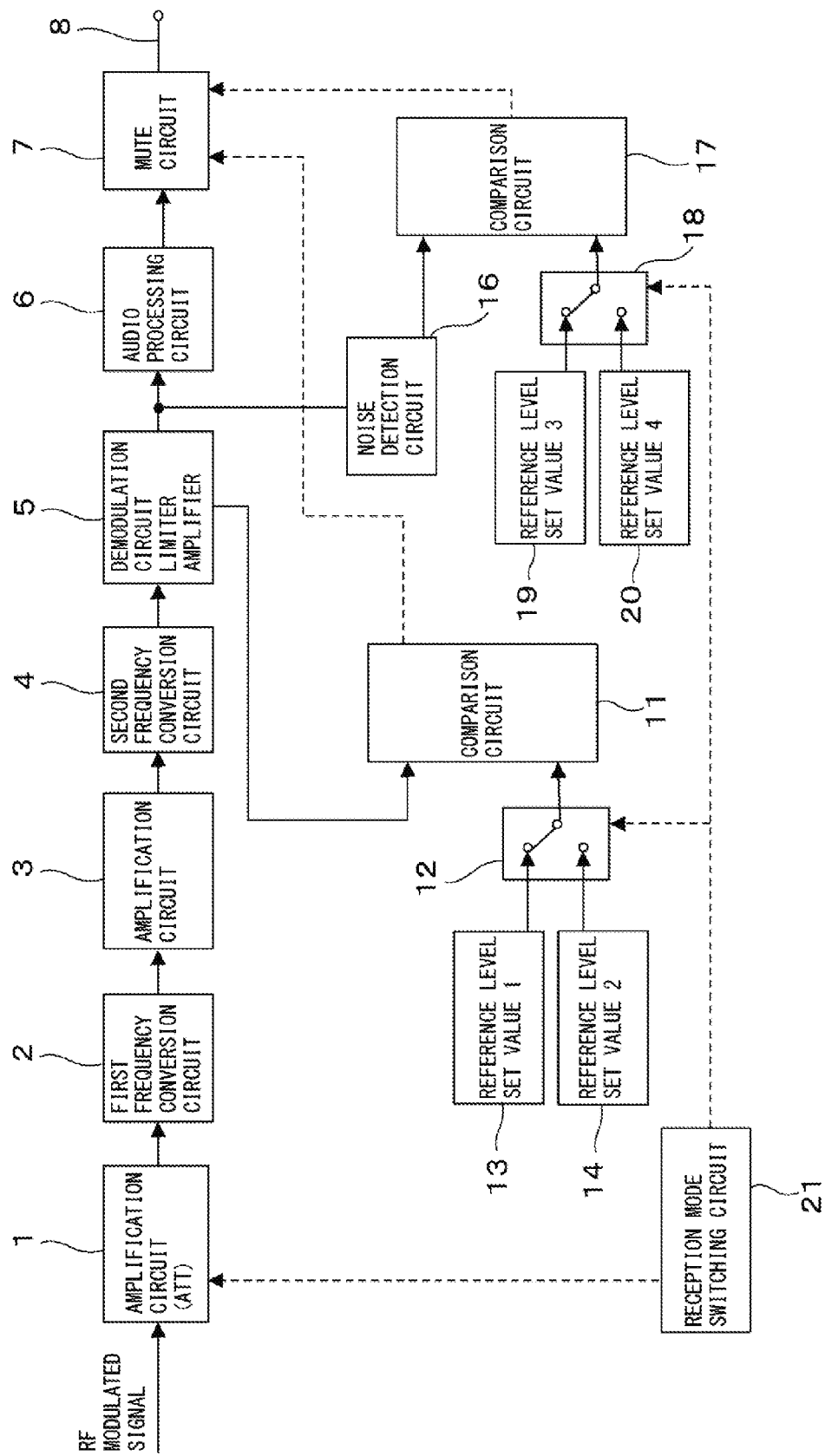
FIG. 1 is a block diagram illustrating an example of a wireless receiver according to the present invention.

A wireless receiver according to the present invention will be described based on an embodiment illustrated in the drawings.

An example illustrated below is a wireless receiver that receives a frequency modulated RF signal (FMRF signal) from a wireless microphone as a transmitter and demodulates an audio signal, and FIG. 1 illustrates an entire configuration of the wireless receiver in a block diagram.

In FIG. 1, a reference symbol 1 represents an RF amplifier and an RF signal from a receiving antenna (not illustrated) is supplied to the RF amplifier.

The RF amplifier circuit 1 includes an attenuation circuit (not illustrated) as an RF signal attenuation circuit at an input side of the circuit, and the attenuator (ATT) allows to select an amount of attenuation of the RF signal fed from the receiving antenna to the RF amplifier circuit 1. The amount of attenuation of the RF signal by the attenuator is selected by using a reception mode switching circuit described later.

Incidentally, the RF signal attenuation circuit can substantially adjust, instead of the attenuator (ATT), the amount of attenuation by controlling an amount of feedback of a gain adjustment circuit, for example AGC, that adjusts amplification gain of the RF amplifier circuit 1.

The RF signal from the RF amplifier circuit 1 is supplied to a first frequency conversion circuit 2. The first frequency conversion circuit 2 is supplied with a signal from a first local signal oscillator (not illustrated) of a PLL synthesizer, for example, and a first intermediate frequency signal (first IF signal) is generated from the RF signal and a first local signal. That is, by selection of the first local signal of the PLL synthesizer, the first intermediate frequency signal corresponding to a particular reception frequency is generated, and is supplied to an intermediate frequency amplification circuit 3. The first IF signal amplified by the intermediate frequency amplification circuit 3 is supplied to a second frequency conversion circuit 4.

The second frequency conversion circuit 4 is supplied with a fixed local signal from a second local signal oscillator (not illustrated), and a second intermediate frequency signal (second IF signal) is generated from the first intermediate frequency signal (first IF signal) and the second local signal. That is, the wireless receiver adopts a double superheterodyne system.

The second intermediate frequency signal (second IF signal) is demodulated to the audio signal by a demodulation circuit 5 including a limiter amplifier, and is supplied to a muting circuit 7 through an audio processing circuit 6. The muting circuit 7 includes a function of receiving a control signal from first and second comparison circuits 11, 17 described later, and opening and closing a signal line of a demodulated signal (audio signal). The demodulated signal passing through the muting circuit 7 is outputted to an audio output terminal 8.

Meanwhile, a level detection output (received signal strength indication: RSSI) of a frequency modulated intermediate frequency (FMIF) signal is extracted from the demodulation circuit 5. The RSSI is information corresponding to strength (electric field strength) of the received RF signal, and the level detection output of the FMIF signal is supplied to the first comparison circuit 11 configuring an RF mute control circuit. It is configured so that a first set value output from a reference level set unit (13) or a second set value output from a reference level set unit (14) selected by a selection switch 12 is selectively supplied to the comparison circuit 11.

That is, the comparison circuit 11 performs level comparison of the level detection output of the FMIF signal with the first set value output or the second set value output selected by the selection switch 12 as the threshold value. In a case where the level detection output of the FMIF signal is greater than the selected threshold value, a command is given to the muting circuit 7 for opening the signal line of the muting circuit 7 and outputting the demodulated signal to the audio output terminal 8. As for relations with the first set value and the second set value, the first set value is set to be greater than the second set value.

The demodulated signal output (audio output) from the demodulation circuit 5 is supplied to a noise detection circuit 16. The noise detection circuit 16 includes, for example, a high-pass filter and a level detection circuit, and gives an output corresponding to a noise level (demodulated noise) in demodulated output. Demodulated noise output from the noise detection circuit 16 is supplied to the second comparison circuit 17 configuring a noise mute control circuit.

It is configured so that a third set value output from a reference level set unit (19) or a fourth set value output from a reference level set unit (20) selected by a selection switch 18 is selectively supplied to the comparison circuit 17. As for relations with the third set value and the fourth set value, the third set value is set to be greater than the fourth set value.

That is, the comparison circuit 17 performs level comparison of the demodulated noise output with the third set value output or the fourth set value output selected by the selection switch 18 as the threshold value.

In a case where the demodulated noise output is smaller than the selected threshold value, a command is given to the muting circuit 7 for opening the signal line of the muting circuit 7 and outputting the demodulated signal to the audio output terminal 8.

In addition, the above-described muting circuit 7 functions to output the demodulated signal (audio output) to the output terminal 8 in a state where the command for opening the signal line from the first comparison circuit 11 and the command for opening the signal line from the second comparison circuit 17 are prepared (a state where AND condition of each command is satisfied). In other words, the demodulated signal is muted in a state where neither of the two commands are generated, or even one of the commands is generated.

The above-described selection switches 12 and 18 are configured so that switching selection is simultaneously performed by the command from a reception mode switching circuit (reception mode switching unit) 21. The embodiment illustrated in FIG. 1 illustrates an example of switching of two stages.

It is configured so that the command from the reception mode switching circuit 21 is also supplied to the above-described RF amplifier circuit 1, and the amount of attenuation of the above-described attenuator arranged at the input side of the RF amplifier circuit 1 is also simultaneously selected.

The above-described reception mode switching circuit 21 in the wireless receiver illustrated in FIG. 1 functions to perform an operation setting of a multi-wave operation mode that is used in a case where multiple wireless microphones are used in a predetermined area, and a normal operation mode that is used in a case where a single wireless microphone is used in the predetermined area.

FIGS. 2A to 2D are schematic diagrams each illustrating a relationship between a reception state and change of radio wave environment (electric field strength and noise) in an actual use state of the wireless receiver.

Figure 3:
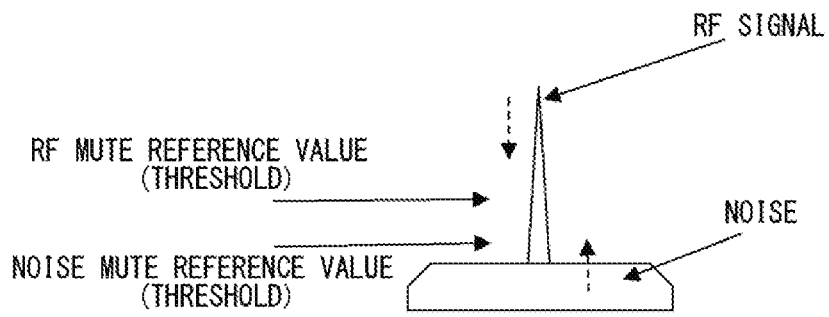
FIG. 3 is a schematic diagram describing meaning of each pattern indicating an RF signal and a noise level illustrated in FIGS. 2A to 2D.

FIG. 3 describes meaning of schematic patterns of the RF signal level and the noise level used in the schematic diagrams in FIGS. 2A to 2D. Therefore, the meaning of each of the schematic patterns illustrating the RF signal and noise level is described first with reference to FIG. 3.

The vertical size (height) between the top side and the bottom side of the trapezoid pattern illustrated in FIG. 3 indicates a level of the demodulated noise output supplied to the second comparison circuit 17 from the noise detection circuit 16 described above.

The vertical size (height) between the tip portion (upper end portion) of the needle-shaped pattern set up on the top center of the trapezoid pattern and the bottom side of the trapezoid pattern indicates strength (electric field strength) of the received RF signal that is supplied to the first comparison circuit 11 from the demodulation circuit 5 described above, that is, a value of the RSSI described above.

When the strength (value of RSSI) of the RF signal is decreased as illustrated by a dashed arrow and falls below an RF mute reference value (threshold) illustrated by a solid arrow, the muting circuit 7 operates to cut off output of the audio signal. When the level of the above-described demodulated noise output increases as illustrated by a dashed arrow and exceeds a noise mute reference value (threshold) illustrated by a solid arrow, the muting circuit 7 operates to cut off output of the audio signal.

FIGS. 2A to 2D illustrate five patterns of different combinations of the RF signal (electric field strength) and the noise level along the horizontal axis direction, and FIG. 2A illustrates an operation example in a case where the setting of the normal operation mode described above is performed. FIG. 2B illustrates an example in which the noise mute threshold (illustrated by the dashed line) increases higher than that of FIG. 2A, and FIG. 2C illustrates an example in which the RF mute threshold (illustrated by the dashed line) decreases lower than that of FIG. 2A.

Furthermore, FIG. 2D illustrates an example in which the noise mute threshold illustrated in FIG. 2B and the RF mute threshold illustrated in FIG. 2C are both adopted, and illustrates an operation example in a case where the setting of the multi-wave operation mode described above is performed.

Compared to a case of the normal operation mode illustrated in FIG. 2A, when the multi-wave operation mode illustrated in FIG. 2D is selected, the wireless receiver works to suppress mute operation due to change of the electric field strength and the noise level by setting the RF mute threshold low, and the noise mute threshold high. For this reason, a stable reception state with less sound interruption by the muting circuit can be achieved, as indicated by "good".

In the reception states of FIGS. 2A to 2D, indicated by "good", the muting circuit 7 does not operate and the demodulated signal is outputted to the output terminal 8. "Bad; RF mute on" indicates that the mute signal is outputted from the first comparison circuit 11 and the muting circuit 7 operates, and "Bad; noise mute on" indicates that the mute signal is outputted from the second comparison circuit 17 and the muting circuit 7 operates.

"RF suppression failure" indicates a state where the RF signal is subjected to suppression by the interference wave and the RF signal level decreases, and "Noise interference" indicates a state where the noise level increases due to the interference wave.

Even in a case where sound interruption occurs due to the mute operation in such failure, the level may still be usable in operation, and, with the present invention, the usable range is expanded.

In addition, relationship between each operation mode and set values 1 through 4 of the reference level is explained below. At the time of normal operation, the set value 1 and the set value 4 are selected and inputted to the comparison circuit 11 and the comparison circuit 17, respectively. And at the time of multi-wave operation, the set value 2 and the set value 3 are selected and inputted to the comparison circuit 11 and the comparison circuit 17, respectively.

Figure 4:
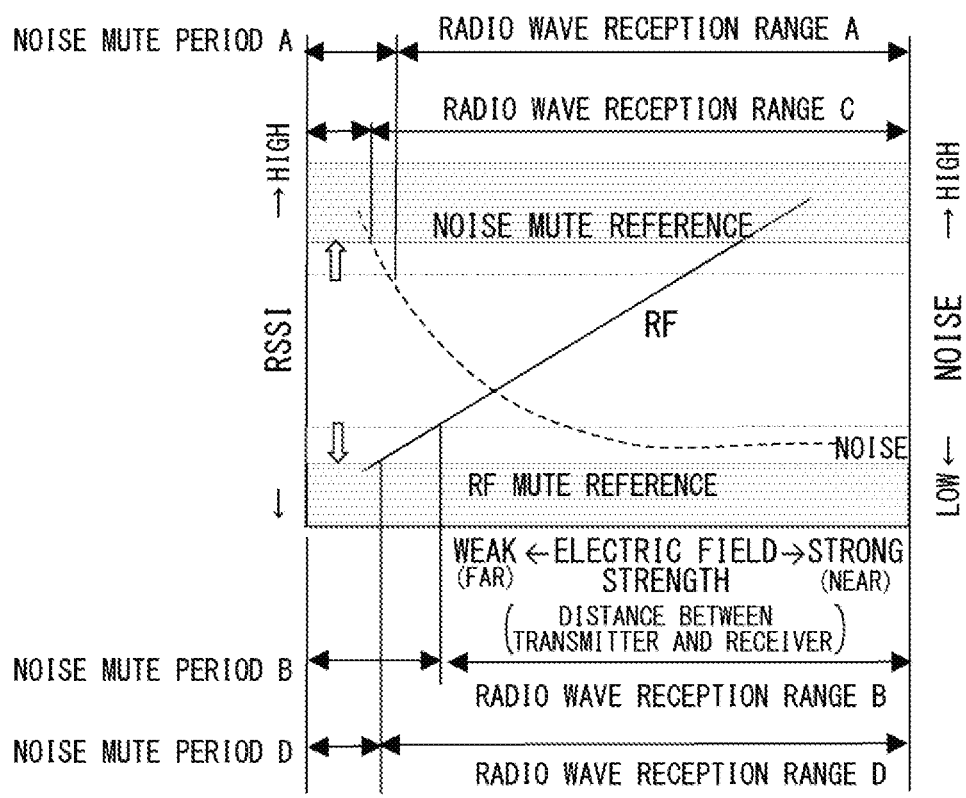
FIG. 4 is a characteristic diagram mainly describing a radio wave reception range of the wireless receiver illustrated in FIG. 1.
Figure 5:
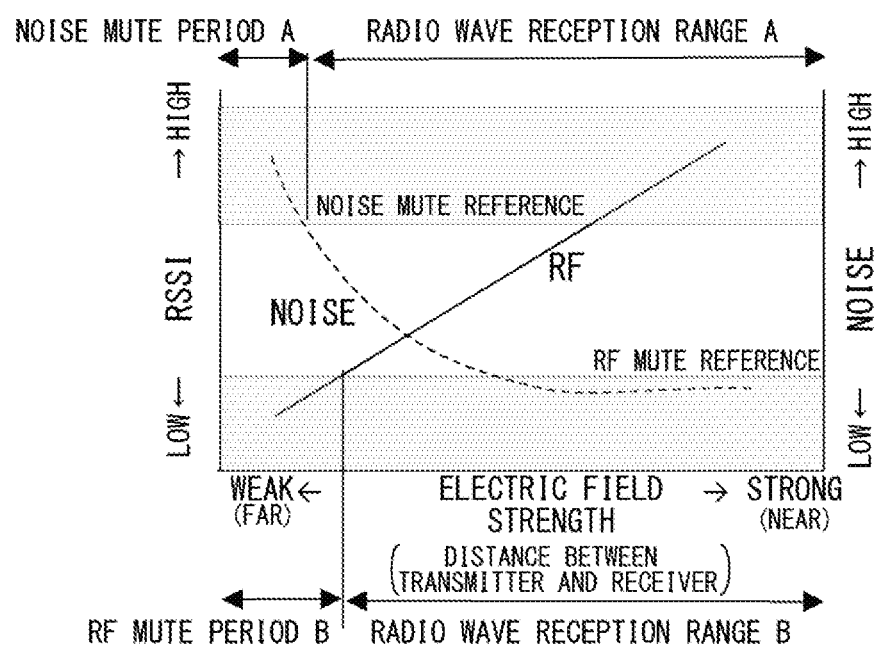
FIG. 5 is a characteristic diagram mainly describing a radio wave reception range of a conventional wireless receiver.

FIGS. 4 and 5 respectively illustrate a characteristic diagram mainly describing a radio wave reception range of the wireless receiver according to the present invention and a similar characteristic diagram of a conventional wireless receiver. In FIGS. 4 and 5, the left vertical axis indicates the strength (RSSI) of the RF signal and the right vertical axis indicates the noise level, and the horizontal axis indicates the electric field strength.

As illustrated in FIGS. 4 and 5, as the electric field strength becomes weaker, an amount of detection of the noise (a noise level illustrated by dashed line) increases accordingly. When the electric field strength becomes weaker, an amount of detection of RF (RF signal level illustrated by solid line) decreases naturally.

By the way, in a conventional example illustrated in FIG. 5, in a case where the wireless microphone moves away from the antenna of the receiver, the electric field strength transitions from strong (horizontal axis right side) to weak (horizontal axis left side). Therefore, regarding a reception range, of a radio wave reception range A and a radio wave reception range B, the radio wave reception range B becomes the reception range to the electric field strength since the RF mute operates earlier.

Meanwhile, with the wireless receiver according to the present invention illustrated in FIG. 4, since the noise mute reference value and the RF mute reference value are changed as illustrated by hollow arrows respectively in the multi-wave operation mode, the reception ranges become a radio wave reception range C and a radio wave reception range D respectively.

In a case where the wireless microphone moves away from the antenna of the receiver, in an example illustrated in FIG. 4 the radio wave reception range D becomes the reception range to the electric field strength since the RF mute starts to operate slightly earlier.

Here, comparing the conventional reception range B with the reception range D of the wireless receiver according to the present invention, it is apparent that the reception range of the wireless receiver according to the invention is expanded.

In a case where the multi-wave operation mode is selected, the amount of attenuation of the attenuator arranged at the input side of the RF amplifier circuit 1 is set greater than that in the normal operation mode (or amplification gain of the RF amplifier circuit 1 is set smaller) by the command from the reception mode switching circuit 21, and thus, IM distortion can be attenuated.

With the wireless receiver according to the present invention described above, at the time of multi-wave operation, occurrence of the IM component is suppressed by attenuating the input RF signal, and the reference voltages of the RF mute and the noise mute are respectively selected to appropriate values.

Therefore, operation sensitivity of the muting circuit due to influence of the interference signal is decreased, and thus, a reduction in the reception reaching distance can be prevented, whereby the wireless receiver can be provided that achieves the stable reception state.

In the above-described embodiment, the operating level of the RF muting circuit, the operating level of the noise muting circuit, and the amount of attenuation in the RF signal attenuation circuit are configured to be selected in two stages by using the reception mode switching circuit 21; however, by being configured so that the operating levels and the amount of attenuation can be selected in multiple stages of three or more stages, a relationship between the noise and the reception distance can be set more finely.

Furthermore, selection of the mute reference value and the like by the reception mode switching circuit 21 illustrated in FIG. 1 is expressed in a configuration of a discrete circuit using an analog switch; however, it is obvious that the configuration can be realized by software processing of a microcomputer including a lookup table and the like.

In addition, in the above-described embodiment, the operating level of the RF muting circuit, the operating level of the noise muting circuit, and the amount of attenuation in the RF signal attenuation circuit are configured to be selected simultaneously by using the reception mode switching circuit 21; however, a similar effect can be obtained when any two of the operating levels and the amount of attenuation are configured to be selected simultaneously.

That is, the reception mode switching unit may be switched according to a carrier strength level of the received RF signal, or the noise level of the demodulated signal. For example, in a case where the level of the RF signal is high and the noise level is high, it may be switched to the multi-wave operation mode.

Furthermore, in the above-described embodiment, description has been made based on the wireless receiver that receives and demodulates the RF signal from the wireless microphone; however, the wireless receiver according to the present invention can obtain a similar effect when adopted in other wireless receiver that receives and demodulates the RF signal, not limited to the wireless receiver that receives the RF signal from the above-described particular transmission source.

What is claimed is:

1. A wireless receiver comprising:
an RF muting circuit that opens and closes a signal line of a demodulated signal according to a carrier strength level of a received RF signal;
a noise muting circuit that opens and closes the signal line of a demodulated signal according to a noise level in the demodulated signal;
an RF signal attenuation circuit that attenuates a level of the RF signal that is handled in an RF amplifier circuit; and
a reception mode switching unit capable of simultaneously selecting at least any two values from those comprising one of a plurality of predetermined operating levels in the RF muting circuit, one of a plurality of predetermined operating levels in the noise muting circuit, and one of a plurality of predetermined amounts of attenuation in the RF signal attenuation circuit,
wherein by using the reception mode switching unit, the operating level of the RF muting circuit is lowered and the operating level of the noise muting circuit is raised, and the amount of attenuation in the RF signal attenuation circuit is increased at a time of multi-wave operation in which multiple transmitters are used in a predetermined area in contrast with a time of normal operation in which a single transmitter is used in the predetermined area.

2. The wireless receiver according to claim 1, wherein the reception mode switching unit is configured to select the operating levels of the RF muting circuit, the operating levels of the noise muting circuit, and the amounts of attenuation in the RF signal attenuation circuit, in multiple steps of two or more.

3. The wireless receiver according to claim 1, wherein a transmitter is a wireless microphone, and the wireless receiver receives a transmission signal from the wireless microphone and generates a demodulated signal.

4. The wireless receiver according to claim 1, wherein the RF signal attenuation circuit is an RF signal attenuator connected to an input side of the RF amplifier circuit.

5. The wireless receiver according to claim 1, wherein the RF signal attenuation circuit includes a gain adjustment circuit that adjusts amplification gain of the RF amplifier circuit.

6. The wireless receiver according to claim 1, further comprising a demodulation circuit receiving the RF signal and providing the carrier strength level, and the demodulated signal supplying to a noise detection circuit, the noise muting circuit being operated according to the carrier strength level and/or noise level from the noise detection circuit.

7. A wireless receiver comprising:
an RF muting circuit that opens and closes a signal line of a demodulated signal according to a carrier strength level of a received RF signal;
a noise muting circuit that opens and closes the signal line of a demodulated signal according to a noise level in the demodulated signal;
an RF signal attenuation circuit that attenuates a level of the RF signal that is handled in an RF amplifier circuit; and
a reception mode switching unit capable of simultaneously selecting at least any two values from those comprising one of a plurality of predetermined operating levels in the RF muting circuit, one of a plurality of predetermined operating levels in the noise muting circuit, and one of a plurality of predetermined amounts of attenuation in the RF signal attenuation circuit,
wherein the RF muting circuit in the wireless receiver includes a first comparison circuit which compares an RSSI signal corresponding to an electric field strength of the received RF signal with a first set value or a second set value both of which are different to each other; and a first selection switch which switches supply of the first set value or the second set value to the first comparison circuit; the noise muting circuit includes a second comparison circuit which compares noise level in the demodulated signal with a third set value or a fourth set value both of which are different to each other; and a second selection switch which switches supply of the third set value or the fourth set value to the second comparison circuit.

8. The wireless receiver according to claim 7, wherein the first set value is set to be greater than the second set value and the third set value is set to be greater than the fourth set value; at the time of normal operation, the reception mode switching unit switches such that the first comparison circuit selects the first set value and the second comparison circuit selects the fourth set value; and at the time of multi-wave operation, the reception mode switching unit switches such that the first comparison circuit selects the second set value and the second comparison circuit selects the third set value.

* * * * *